(12) United States Patent
Liebregts et al.

(10) Patent No.: US 7,561,250 B2
(45) Date of Patent: Jul. 14, 2009

(54) LITHOGRAPHIC APPARATUS HAVING PARTS WITH A COATED FILM ADHERED THERETO

(75) Inventors: Paulus Martinus Maria Liebregts, Veldhoven (NL); Menno Fien, Tilburg (NL); Erik Roelof Loopstra, Heeze (NL); Ronald Van Der Ham, Maarheeze (NL); Wilhelmus Franciscus Johannes Simons, Beesel (NL); Daniel Jozef Maria Direcks, Vaals (NL); Franciscus Johannes Joseph Janssen, Eindhoven (NL); Gert-Jan Gerardus Johannes Thomas Brands, Waalre (NL); Koen Steffens, Heerlen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/812,507

(22) Filed: Jun. 19, 2007

(65) Prior Publication Data

US 2008/0316441 A1 Dec. 25, 2008

(51) Int. Cl.
G03B 27/42 (2006.01)
G03B 27/52 (2006.01)
G03B 27/58 (2006.01)
G03B 27/32 (2006.01)

(52) U.S. Cl. .............................. 355/53; 355/30; 355/72; 355/77; 430/311
(58) Field of Classification Search ................. 355/30, 355/53, 67, 72, 75, 77; 430/30, 311, 396, 430/5
See application file for complete search history.

(56) References Cited

U.S. PATENT DOCUMENTS

| | | | | |
|---|---|---|---|---|
| 3,706,485 | A * | 12/1972 | Fawcett et al. | 359/588 |
| 4,131,363 | A * | 12/1978 | Shea et al. | 355/75 |
| 5,008,156 | A * | 4/1991 | Hong | 428/506 |
| 6,190,743 | B1 * | 2/2001 | Wang | 428/14 |
| 2003/0112421 | A1 * | 6/2003 | Smith | 355/71 |
| 2004/0119954 | A1 | 6/2004 | Kawashima et al. | 355/30 |
| 2006/0023181 | A1 * | 2/2006 | Novak | 355/53 |
| 2007/0242242 | A1 * | 10/2007 | Nagasaka et al. | 355/53 |

FOREIGN PATENT DOCUMENTS

| | | | |
|---|---|---|---|
| WO | WO 2004/093160 | * | 10/2004 |
| WO | WO 2004/093160 A2 | | 10/2004 |

* cited by examiner

*Primary Examiner*—Alan A Mathews
(74) *Attorney, Agent, or Firm*—Pillsbury Winthrop Shaw Pittman LLP

(57) ABSTRACT

A lithographic apparatus is disclosed having a removable adhesive film carrying a coating on at least a part of the apparatus. In an embodiment, a liquid supply system having a liquid confinement structure extending along at least part of a boundary of a space between a projection system and a substrate support is disclosed, wherein the film carrying the coating is on at least part of the liquid confinement structure.

36 Claims, 3 Drawing Sheets

LITHOGRAPHIC APPARATUS HAVING PARTS WITH A COATED FILM ADHERED THERETO

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may be of a type wherein the substrate is immersed in a liquid having a relatively high refractive index, e.g. water so as to fill a space between the final element of the projection system and the substrate. Immersion liquids may also be applied to other spaces in the lithographic apparatus, for example, between the mask and the first element of the projection system. Immersion lithography is mentioned in, for example, United States patent application publication no. US 2004/0119954 and PCT patent application publication no. WO 2004/093160.

SUMMARY

In an immersion type lithography apparatus the contact angle of the wetted surfaces may be significant. However, the contact angle may degrade during use, for example because of exposure to radiation, mechanical contact, etc. The use of an immersion liquid may also or alternatively result in stains on a projection system, a substrate support, or other part of the lithographic apparatus in the vicinity of the liquid or possible vapors emanating from the liquid. For example, stains may be left on a sensor that may be present on the substrate support. This could lead to inaccuracy in, e.g. aligning a substrate with a patterning device and/or a decreased lifetime of the sensor.

An additional or alternative problem that may arise in a lithographic apparatus is the deposition and build up of contaminants on one or more parts of the apparatus, for example a sensor. Such contaminants may originate from, e.g., leach products out of the resist process. Deposition of contaminants may, depending on the location of the deposition, lead to concerns relating to, e.g. the abovementioned contact angle, the lifetime of an apparatus part, alignment, leveling, sensor grating deterioration, and/or radiation blocking.

A local thin film seal may be applied on a part of the top surface of the substrate support of an immersion type lithography apparatus in order to protect it against the immersion liquid. The local individual thin film seal however may require local hydrophilic clearance and/or form a height step. Because of this, immersion liquid may be left and undesired forces may be introduced.

Further, parts of the top surface of a substrate support of a lithographic apparatus may be locally coated with a coating in order to protect it against UV radiation. These local coatings are however subject to wear, for example because of unintended contact and/or degradation by use, resulting in a change of the surface hydrophobic properties. Damaging of the coating results in a costly replacement or refurbishment of the part to be protected by the coating, in this case the substrate support.

There are numerous methods, such as chemical vapor deposition and ion beam sputtering, for applying the coating. Systems using these approaches principally are designed to very precisely coat the desired surfaces. As a result they are expensive, and require extensive set-up time.

Accordingly, it is desirable, for example, to provide a lithographic apparatus that is properly protected against negative influences from, e.g., UV radiation and/or immersion liquid.

According to an embodiment of the invention, there is provided a lithographic apparatus comprising:
- an illumination system configured to condition a radiation beam;
- a support constructed to support a patterning device, the patterning device being capable of imparting the radiation beam with a pattern in its cross-section to form a patterned radiation beam;
- a substrate support constructed to hold a substrate;
- a projection system configured to project the patterned radiation beam onto a target portion of the substrate; and
- a removable adhesive film carrying a coating on at least part of the apparatus.

According to an embodiment of the invention, there is provided a device manufacturing method, comprising:
- imparting a radiation beam with a pattern in its cross-section;
- projecting the patterned radiation beam onto a target portion of a substrate using a lithographic apparatus, a removable adhesive film carrying a coating on at least a part of the apparatus;
- developing the projected substrate; and
- manufacturing a device from the developed substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
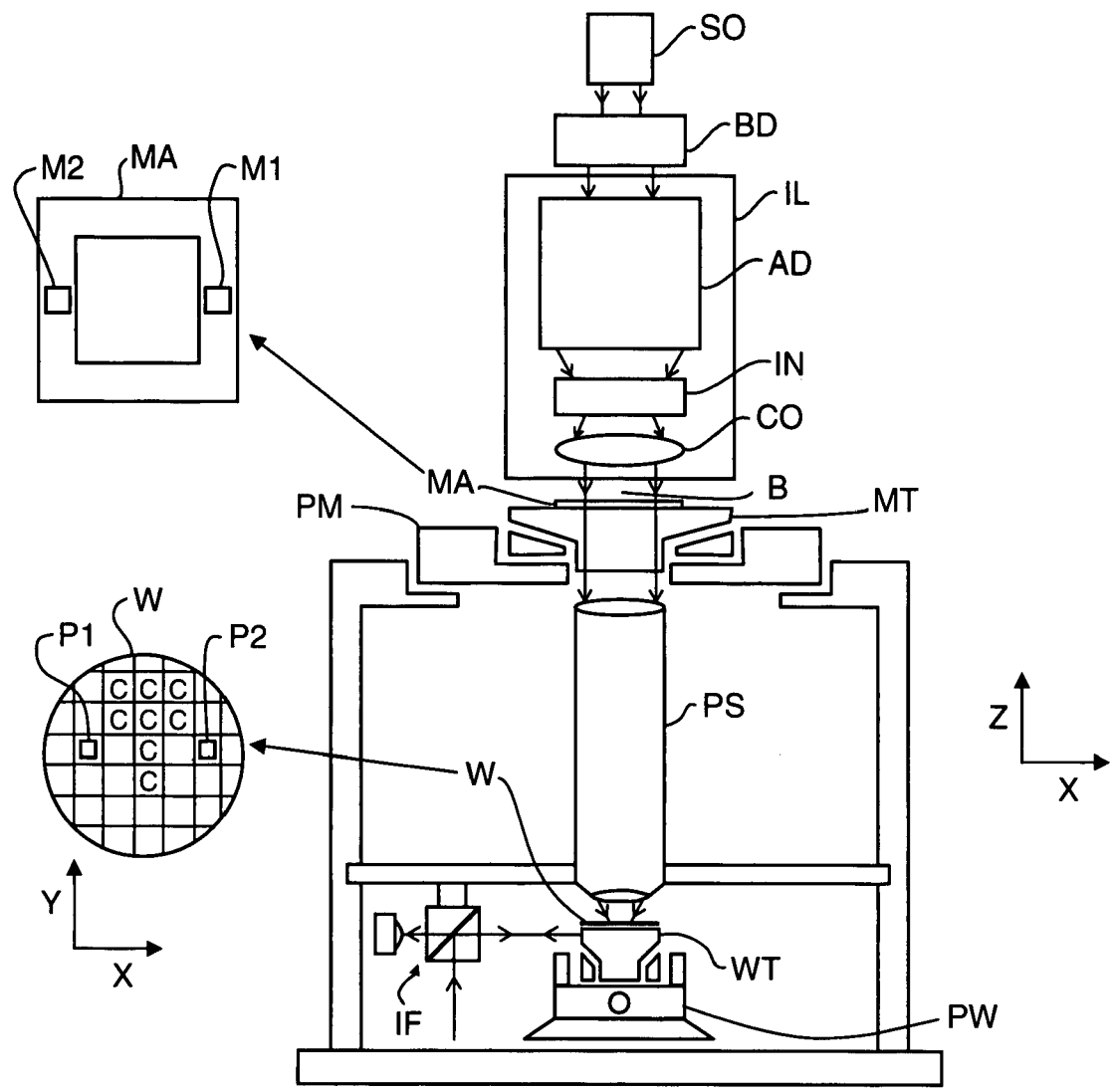
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate support (e.g. a substrate table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more patterning device supports). In such "multiple stage" machines the additional supports may be used in parallel, or preparatory steps may be carried out on one or more supports while one or more other supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator. IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
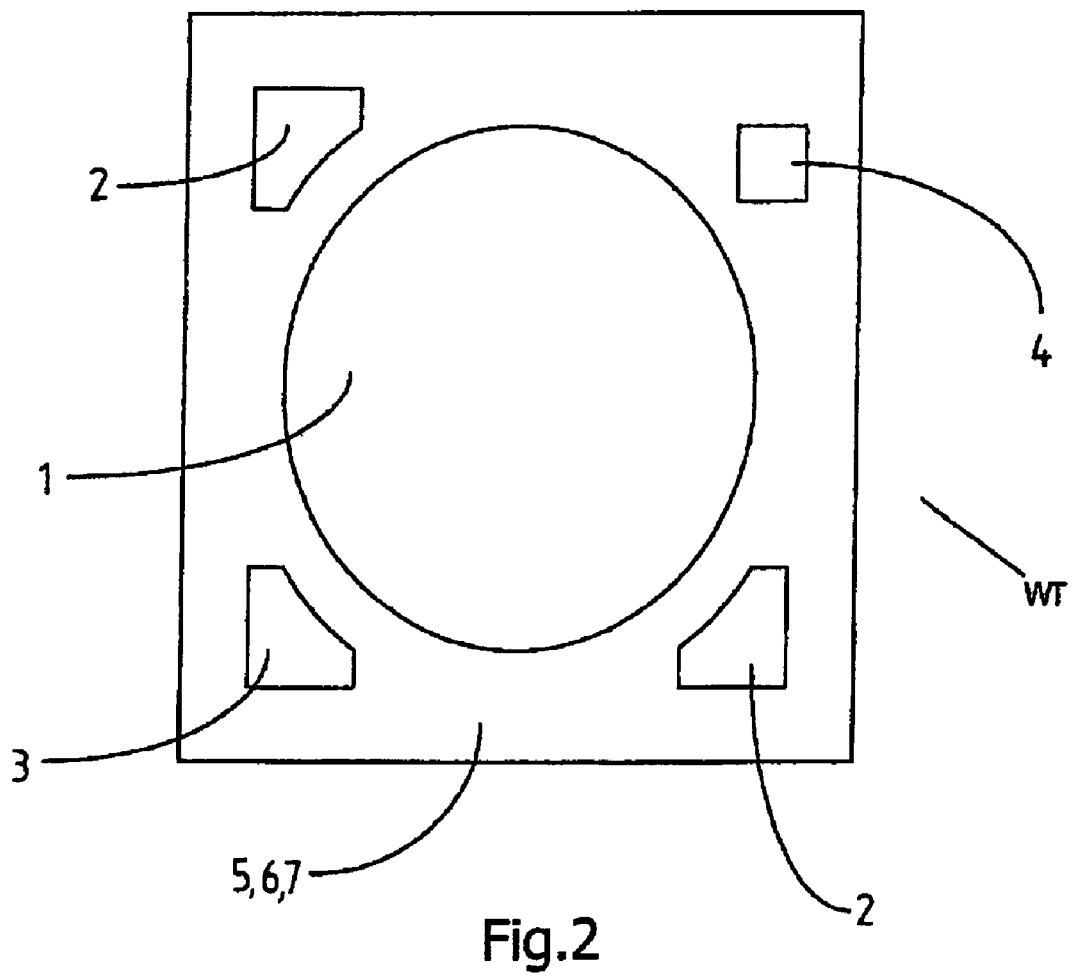
FIG. 2 shows a top view of the substrate support of FIG. 1.

FIG. 2 is a schematic view in plan of the top surface of a substrate support WT. The top surface comprises various orifices. The central (circular) orifice is a recess 1 in which a substrate is positioned. Several other components are positioned around the central orifice and are arranged to be illuminated by the patterned beam of the projection system PS. These components may be sensors, like two transmission image sensors 2, a spot sensor 3 and an integrated lens interferometer 4. They also may be one or more other kinds of measuring devices, sealing devices and/or actuators. In order to, for example, properly protect the top surface against UV radiation coming from the projection system PS, a removable film 5 carrying a functional coating 6 is applied (see FIG. 3). The inner side of the film 5 is provided with an adhesive layer 7. The functional coating in this case is at least protective against UV radiation.

The adhesive film 5 carrying the coating 6 may cover substantially the whole top surface of the substrate support WT, including the components located in the top surface. Desirably however, the adhesive film 5 carrying the coating 6 covers the top surface of the substrate support WT with the exception of openings provided therein for the components located in the top surface, and/or with the exception of the recess 1 for the substrate W. Thus the adhesive film 5 carrying the coating 6 comprises openings for the components and/or the substrate W. This has an advantage that the components and/or substrate may be removed and/or replaced without having to remove the entire adhesive film 5 carrying the coating 6. The components in this case may be separately covered by individual protective covering elements, which can advantageously be formed by parts of the same material of the adhesive film 5 carrying the coating 6.

Applying the adhesive film carrying the coating according to an embodiment of the invention advantageously reduces the radiation-induced deterioration of the part of the apparatus it is adhered to. The coating, for example, can be opaque to ultra-violet wavelengths that could otherwise damage the part of the apparatus. It is also or alternatively possible that a radiation absorbing coating is used. Accurately applying a coating with a precise thickness and with expensive equipment directly onto such parts of the apparatus to be protected, is no longer necessary. Instead the coating can be easily, quickly and reliably applied onto the film at an earlier stage outside the lithographic apparatus, e.g. shortly after the manufacturing of the film and/or after the applying of the film with the adhesive layer. The coating may be provided on the film by any suitable method or process. In an embodiment, the coating is applied by sputtering, spin coating, dip coating or low vacuum plasma process. Subsequently the film together with the coating can be easily, quickly and reliably adhered onto the desired part of the apparatus. This is time and cost saving. It is noted that the coating not only protects the desired part of the apparatus, but also protects the film and the adhesive layer itself against the radiation-induced deterioration. Because the adhesive film carrying the coating is removable, a new one, that is to say an entire new film with adhesive and coating, can easily replace it if desired. After such a replacement, the part of the apparatus it is adhered to is adequately protected again for some time. This substantially prolongs the lifetime of that part and adds to the accuracy of the manufacturing process of substrates using the lithographic apparatus. Furthermore the adhesive film carrying the coating may be additionally or alternatively advantageously be applied onto a part of the apparatus where a coating may not directly be applied to, for example because the part may under no circumstance be heated.

The film may be made out of a thin foil material like a metallic foil. The film may have any suitable thickness. In an embodiment the thickness of the film is at least 9 micrometers and has a maximum thickness of 11 micrometers. Advantageously the film carrying the coating has substantially the same thermal expansion characteristics as the part of the apparatus it is adhered to, in this case the substrate support WT. In an embodiment the film may be provided with ribbons or a bellow-like structure such that it is able to easily expand and/or contract together with the substrate support if desired.

The coating 6 may be made of a material that is protective against ultra-violet radiation. In an embodiment, the coating is a hydrophobic coating, more particularly, for example, a hydrophobic coating comprising polymerized hexamethyldisiloxane. In addition or as an alternative, the coating comprises a compound out of the family of silicones and/or titanium oxides. Other organoxy-metallic compounds may also be used. The coating may have any suitable thickness. In an embodiment, the thickness of the coating is at least 400 nanometers and has a maximum thickness of 600 nanometers.

The adhesive layer 7 comprises an adhesive such that the film together with its coating can be easily removed from the top surface of the part it is adhered to, in this case the substrate support WT, desirably manually. The adhesive should adhere to the film carrying the coating with sufficient strength such that, during normal operation, the film carrying the coating remains in place and is not easily damaged by unintended contact. In an embodiment the adhesive layer 7 comprises a hot melt adhesive, in particular a pressure sensitive hot melt adhesive. For example, a tri block polymer, e.g. styrene-isoprene-styrene, can be used. It is noted that although such an adhesive is sensitive to prolonged exposure to UV radiation, according to an embodiment of the invention this is not a problem as the coating may protect the adhesive. The adhesive layer may have any suitable thickness. In an embodiment, the thickness of the adhesive layer is at least 9 micrometers and has a maximum thickness of 11 micrometers.

Figure 4:
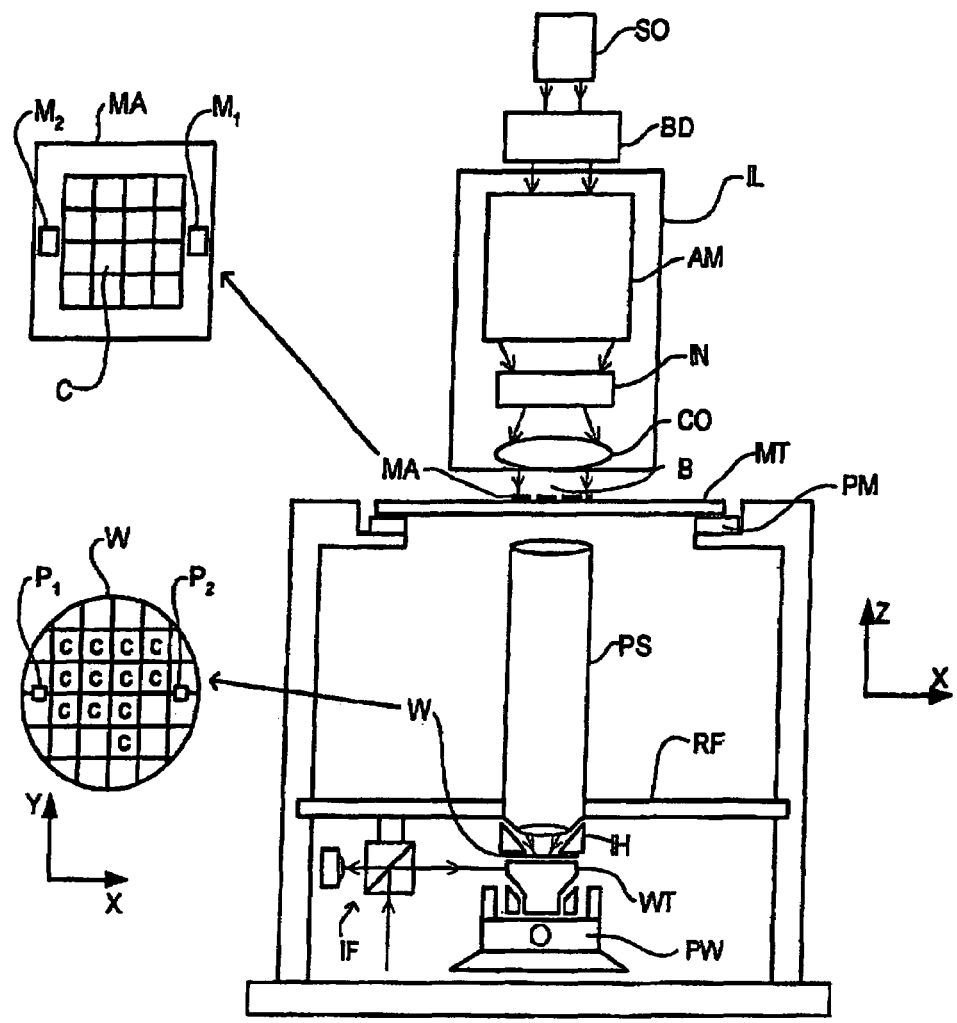
FIG. 4 shows an immersion type lithographic apparatus according to an embodiment of the invention.
Figure 5:
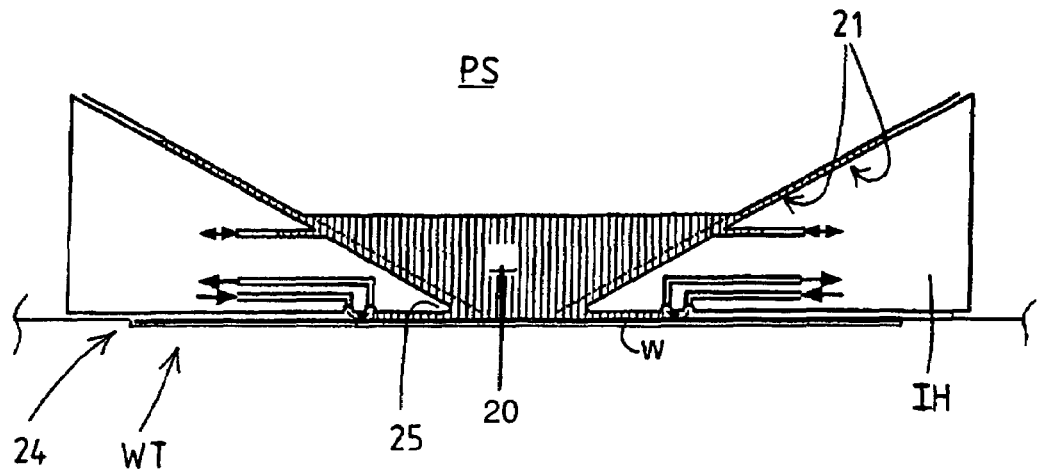
FIG. 5 shows an enlarged view of the substrate support with immersion hood of FIG. 4.

FIGS. 4 and 5 show an embodiment of an immersion lithographic apparatus which in addition to the embodiment of FIG. 1 comprises a liquid supply system having a liquid confinement structure, sometimes referred to as the immersion hood IH, which extends along at least part of a boundary of a space between a final element of the projection system PS and the substrate support WT. The confinement structure may extend a little above the final element of the projection system. The liquid supply system is used to supply liquid to the space defined by the confinement structure between the final element of the projection system PS and the substrate W. With this the liquid level rises above the final element so that a buffer of liquid is provided. Thus a reservoir of liquid 20 is formed which may be sealed in the space by a contactless seal to the substrate W around the image field of the projection system PS.

According to an embodiment, a removable adhesive film carrying a functional coating is provided on at least part of the liquid confinement structure. In particular at least the top surface 21 thereof may be provided with the removable adhesive film carrying the coating. In this case the functional coating is such that it has one or more desired properties, in particular the desired contact angle. Thus it is possible to each time provide a surface with a "renewable" top layer having the desired property(ies). If desired the coating may also be such that the part of the structure is properly protected against negative influences from the immersion liquid and/or deterioration from the radiation coming from the projection system PS. Other parts of the structure may also or instead be protected with such an adhesive film carrying a coating.

Figure 3:
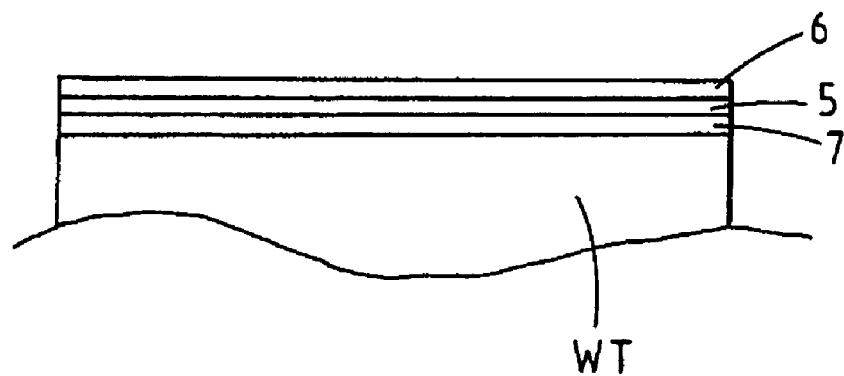
FIG. 3 shows a schematic enlarged side view of FIG. 2.

Furthermore like in the embodiment of FIGS. 2 and 3, the substrate support WT also may have an adhesive film carrying the coating adhered thereto. This helps to keep the liquid within the confinement structure, particularly if an edge part 24 of the top surface of the substrate support WT neighboring the substrate W comes to lie opposite an inner peripheral edge part 25 of the confinement structure. Also it helps to prevent the forming of stains onto the top surface of the substrate support WT. In this case the coating desirably is a hydrophobic material having a water contact angle of more than 85 (receding contact angle) or more than 95 (static contact angle). Such a hydrophobic coating is known to avoid staining of the part it covers by an aqueous liquid, for example the immersion liquid. In an embodiment the hydrophobic coating comprises a titanium oxide. This has an advantage in that it is a catalyst for breaking down of hydrocarbons, which are in a resist used for lithography, under the influence of UV radiation. Thus the system with the adhesive film carrying the coating may be somewhat self-cleaning during use.

Besides the embodiments shown, numerous alternatives are possible. For example, the film carrying the coating may be provided on one or more other parts of the apparatus that are exposed to radiation or wetted with an immersion liquid during operation of the apparatus, e.g. a part of the illumination system, of the patterning device support, of the substrate support and/or of the projection system. In particular the film may be adhered to an upper or lower side of the projection system along its edge parts, on top of the patterning device support, etc. It also may be adhered on the top or bottom of a so-called closing disk that may be provided in the substrate support adjacent the substrate in an immersion lithography apparatus. Such a closing disk can temporarily take the place of a substrate beneath the liquid confinement structure, and thus seal the confinement structure, for example, during an exchange of the substrate.

In an embodiment, several of the adhesive films carrying the coating may be provided stacked on top of each other. The adhesive films carrying the coating can be torn off one by one when needed, that is to say, e.g., after they have been damaged or deteriorated in such a way that they can no longer perform their function properly anymore. Because now only the removal of a used film is needed, the downtime of the apparatus may be minimized. In an alternative, it is possible to each time place a new adhesive film carrying the coating on top of an old one as soon as desired.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a removable adhesive film, having a maximum thickness of 11 micrometers, carrying a coating on at least part of the apparatus, wherein, in use, the at least part of the apparatus is wetted with an immersion liquid but for the film or follows the film in a path of radiation from the radiation beam.

2. The lithographic apparatus of claim 1, further comprising a liquid supply system having a liquid confinement structure which extends along at least part of a boundary of a space between the projection system and the substrate support, the film carrying the coating being on at least part of the liquid confinement structure.

3. The lithographic apparatus of claim 1, wherein the film carrying the coating is on at least part of (i) the illumination system, or (ii) the patterning device support, or (iii) the substrate support, or (iv) the projection system, or (v) any combination selected from (i) to (iv).

4. The lithographic apparatus of claim 3, wherein the film carrying the coating is on at least part of a top surface of the substrate support.

5. The lithographic apparatus of claim 4, wherein the film carrying the coating covers substantially the whole of the top surface of the substrate support.

6. The lithographic apparatus of claim 4, wherein the film carrying the coating covers the top surface of the substrate support with the exception of one or more openings in the substrate support for one or more devices located in the top surface.

7. The lithographic apparatus of claim 6, wherein the one or more devices located in the top surface comprise (i) a measuring device, or (ii) a sealing device, or (iii) an actuator, or (iv) any combination selected from (i) to (iii).

8. The lithographic apparatus of claim 6, wherein the film carrying the coating comprises one or more openings corresponding to the one or more openings in the substrate support.

9. The lithographic apparatus of claim 1, comprising a plurality of adhesive films, each carrying the coating, arranged in a stack.

10. The lithographic apparatus of claim 1, wherein the film comprises a metallic foil.

11. The lithographic apparatus of claim 1, wherein the film carrying the coating has substantially the same thermal expansion characteristic as the at least part of the apparatus.

12. The lithographic apparatus of claim 1, wherein the coating is protective against ultra-violet radiation.

13. The lithographic apparatus of claim 1, wherein the coating is a hydrophobic coating.

14. The lithographic apparatus of claim 13, wherein the hydrophobic coating comprises polymerized hexamethyldisiloxane.

15. The lithographic apparatus of claim 1, wherein the coating has a maximum thickness of 600 nanometers.

16. The lithographic apparatus of claim 1, wherein the coating comprises a silicone.

17. The lithographic apparatus of claim 1, wherein the coating comprises titanium oxide.

18. The lithographic apparatus of claim 1, wherein the coating has a water contact angle of at least 85 degrees.

19. The lithographic apparatus of claim 1, wherein the adhesive film comprises a hot melt adhesive.

20. The lithographic apparatus of claim 1, wherein the adhesive film comprises an adhesive layer having a maximum thickness of 11 micrometers.

21. A device manufacturing method, comprising:
    imparting a radiation beam with a pattern in its cross-section;
    projecting the patterned radiation beam onto a target portion of a substrate using a lithographic apparatus, a removable adhesive film, having a maximum thickness of 11 micrometers, carrying a coating on at least a part of the apparatus, the at least part of the apparatus wetted with an immersion liquid but for the film or following the film in a path of radiation from the radiation beam;
    developing the projected substrate; and
    manufacturing a device from the developed substrate.

22. The method of claim 21, wherein the film carrying the coating is on at least part of a top surface of a substrate support holding the substrate.

23. The method of claim 21, comprising a plurality of adhesive films, each carrying the coating, arranged in a stack.

24. The method of claim 21, wherein the coating is protective against ultra-violet radiation.

25. The method of claim 21, wherein the coating is a hydrophobic coating.

26. The method of claim 21, wherein the adhesive film comprises an adhesive layer having a maximum thickness of 11 micrometers.

27. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate support constructed to hold a substrate;
    a projection system configured to project the patterned radiation beam onto a target portion of the substrate; and
    a removable adhesive deformable film carrying a coating on at least part of the apparatus, the coating configured to reduce radiation-induced deterioration of the at least part of the apparatus.

28. The lithographic apparatus of claim 27, further comprising a liquid supply system having a liquid confinement structure which extends along at least part of a boundary of a space between the projection system and the substrate support, the film carrying the coating being on at least part of the liquid confinement structure.

29. The lithographic apparatus of claim 27, wherein the film carrying the coating is on at least part of the apparatus that is exposed to radiation during operation of the apparatus.

30. The lithographic apparatus of claim 27, wherein the film carrying the coating is on at least part of a top surface of the substrate support.

31. The lithographic apparatus of claim 27, comprising a plurality of adhesive films, each carrying the coating, arranged in a stack.

32. The lithographic apparatus of claim 27, wherein the coating is protective against ultra-violet radiation.

33. The lithographic apparatus of claim 27, wherein the coating is a hydrophobic coating.

34. The lithographic apparatus of claim 27, wherein the adhesive film has a maximum thickness of 11 micrometers.

35. The lithographic apparatus of claim 27, wherein the adhesive film comprises an adhesive layer having a maximum thickness of 11 micrometers.

36. A device manufacturing method, comprising:
    imparting a radiation beam with a pattern in its cross-section;
    projecting the patterned radiation beam onto a target portion of a substrate using a lithographic apparatus, a removable adhesive deformable film carrying a coating on at least a part of the apparatus, the coating configured to reduce radiation-induced deterioration of the at least part of the apparatus;
    developing the projected substrate; and
    manufacturing a device from the developed substrate.

* * * * *